United States Patent
Vickers (10) Patent No.: US 8,903,109 B2
(45) Date of Patent: Dec. 2, 2014

(54) FREQUENCY DOMAIN MULTIBAND DYNAMICS COMPRESSOR WITH AUTOMATICALLY ADJUSTING FREQUENCY BAND BOUNDARY LOCATIONS

(75) Inventor: Earl C. Vickers, Saratoga, CA (US)

(73) Assignee: STMicroelectronics, Inc., Coppell, TX (US)

( * ) Notice: Subject to any disclaimer, the term of this patent is extended or adjusted under 35 U.S.C. 154(b) by 1198 days.

(21) Appl. No.: 12/821,858

(22) Filed: Jun. 23, 2010

(65) Prior Publication Data

US 2011/0320209 A1 Dec. 29, 2011

(51) Int. Cl.
*H03G 9/00* (2006.01)
*H03G 5/00* (2006.01)
*H03G 9/02* (2006.01)

(52) U.S. Cl.
CPC .................................. *H03G 9/025* (2013.01)
USPC .......................... 381/102; 381/103

(58) Field of Classification Search
CPC ....... H03G 5/0005; H03G 5/00; H03G 9/005; H03G 9/99; H03G 9/025; H03G 3/3089; H03G 5/165; H04B 1/1036; H04B 14/046; H04B 1/0475; H04B 1/64; H04B 10/25073; H04R 25/356; G10L 21/0232; H04S 1/002; H04S 2420/01; H04S 1/00
USPC .......... 381/98, 101–103, 66, 83, 93, 318, 320
See application file for complete search history.

(56) References Cited

U.S. PATENT DOCUMENTS

| | | | |
|---|---|---|---|
| 3,789,143 A | 1/1974 | Blackmer | |
| 4,249,042 A | 2/1981 | Orban | |
| 4,460,871 A | 7/1984 | Orban | |
| 5,528,145 A * | 6/1996 | Hirata et al. | ................... 324/309 |
| 5,677,987 A * | 10/1997 | Seki et al. | ...................... 704/226 |
| 6,434,246 B1 * | 8/2002 | Kates et al. | ................... 381/312 |
| 6,535,846 B1 | 3/2003 | Shashoua | |
| 7,366,315 B2 | 4/2008 | Blamey et al. | |
| 7,774,201 B2 | 8/2010 | Yamada | |
| 7,848,531 B1 | 12/2010 | Vickers et al. | |
| 8,045,739 B2 | 10/2011 | Paludan-Mueller et al. | |
| 8,090,576 B2 | 1/2012 | Erell | |
| 8,204,258 B2 | 6/2012 | Craig et al. | |
| 2008/0004995 A1 | 1/2008 | Klingenberg et al. | |
| 2009/0281803 A1 | 11/2009 | Chen et al. | |
| 2012/0278087 A1 | 11/2012 | Hosokawa | |

OTHER PUBLICATIONS

Franck et al: "Evaluation of Spectral Enhancement in Hearing Aids, Combined With Phonemic Compression," JAS, 1999.
Vickers, Earl, "The Non-Flat and Continually Changing Frequency Response of Multiband Compressors", Audio Engineering Society, Convention Paper, Presented at the 129th Convention, Nov. 4-7, 2010, San Francisco, CA, USA, pp. 1-15.

(Continued)

*Primary Examiner* — Ping Lee
(74) *Attorney, Agent, or Firm* — Gardere Wynne Sewell LLP (57) ABSTRACT

A multiband dynamics compressor implements a frequency-domain solution for addressing unwanted magnitude peaks which may occur at the crossover frequency (boundary) between two adjacent frequency bands. The solution proposes making slight adjustments to the frequency band boundary locations, for example on a frame-by-frame basis, in order to prevent a spectral peak in the input signal from being located midway between two frequency bands. The adjustment to the boundary location pushes the energy of the spectral peak substantially into one frequency band for compression.

25 Claims, 7 Drawing Sheets

(56) References Cited

OTHER PUBLICATIONS

MacLeod, M.D., "Nonlinear Recursive Smoothing Filters and Their Use for Noise Floor Estimation", Electronics Letters, Oct. 8, 1992, vol. 28, No. 21, pp. 1952-1953.

Moore et al., "Why are Commercials so Loud?—Perception and Modeling of the Loudness of Amplitude-Compressed Speech" J. Audio Eng. Soc., vol. 51, No. 12, Dec. 2003, pp. 1123-1132.

Lindemann, Eric, "The Continuous Frequency Dynamic Range Compressor", IEEE Xplore, Dec. 16, 2009, pp. 1-4.

Jones, Sarah, "The Big Squeeze, Mastering Engineers Debate Music's Loudness Wars", http://mixonline.com/mag/audip_big_squeeze, May 25, 2010, pp. 1-6.

Kates, James, M., "Trends in Amplification, Principles of Digital Dynamic-Range Compression" http://tia.sagepub.com/cgi/content/abstract/9/2/45, vol. 9, No. 2, 2005 pp. 45-76.

Laroche et al., "New Phase-Vocoder Techniques for Real-Time Pitch Shifting, Chorusing, Harmonizing, and Other Exotic Audio Modifications", J. Audio Eng. Soc., vol. 47, No. 11, Nov. 1999, pp. 928-936.

Bohn, Dennis, "RaneNote, Linkwitz-Riley Crossovers: A Primer", RaneNote 160, 2005 Rane Corporation, pp. 1-14.

McNally, G.W., "Dynamic Range Control of Digital Audio SIgnals" J. Audio Eng. Soc., vol. 32, No. 5, May 1984, pp. 316-327.

Vickers, Earl, "Automatic Long-Term Loudness and Dynamics Matching" Audio Engineering Society, Convention Paper 5495, Presented at the 111th Convention, Sep. 21-24, 2001, New York, NY, USA, pp. 1-11.

Foti, Frank, "Aliasing Distortion in Digital Dynamics Processing, the Cause, Effect, and Method for Measuring It: The Story of "Digital Grunge!"", Presented at the 106th Convention May 8-11, 1999, Munich, Germany, pp. 1-10.

Linkwitz, Siegfried, H., "Active Crossover Networks for Noncoincident Drivers", Journal of the Audio Engineering Society, Jan./Feb. 1976, vol. 24, No. 1, pp. 2-8.

Horner, et al., "A Search for Best Error Metrics to Predict Discrimination of Original and Spectrally Altered Musical Instrument Sounds", J. Audio Eng., Soc., vol. 54, No. 3, Mar. 2006, pp. 140-156.

Vickers, Earl, "Frequency-Domain Multi-band Compressor", AES 129th Convention, San Francisco, CA, USA, Nov. 4-7, 2010, pp. 1-7.

Book Excerpt, Chapter 7, "Dynamic Range Control", Date Unknown, pp. 207-219.

Book Excerpt, Chapter 10, "How to Manipulate Dynamic Range for Fun and Profit, Part Two: Downward Processors", Date Unknown, pp. 119-132.

* cited by examiner

FREQUENCY DOMAIN MULTIBAND DYNAMICS COMPRESSOR WITH AUTOMATICALLY ADJUSTING FREQUENCY BAND BOUNDARY LOCATIONS

TECHNICAL FIELD

The present invention relates to multiband dynamic range compressors.

BACKGROUND

Dynamics compression may be used during audio mastering, broadcast or playback to adjust the gain as a function of time, in order to achieve a desired distribution of output levels. This type of compression (not to be confused with data compression algorithms such as mp3) helps keep the volume in the "sweet spot" between too soft and too loud, reducing the user's need to manually adjust (or "ride") the volume. Dynamics compression allows the quiet portions of the program to remain audible, even in a relatively noisy environment, while keeping the louder parts from becoming disturbingly loud.

Figure 1:
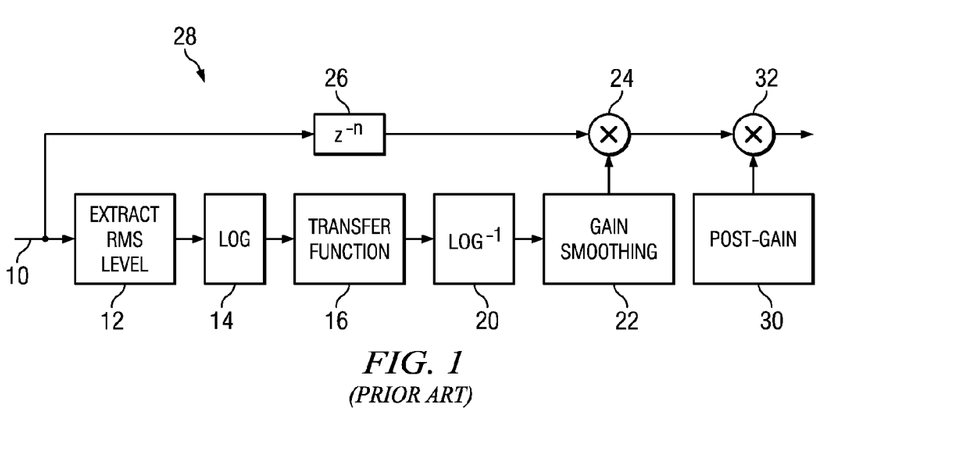
FIG. 1 is a block diagram of a typical feed-forward single-band dynamics compressor.
Figure 2A:
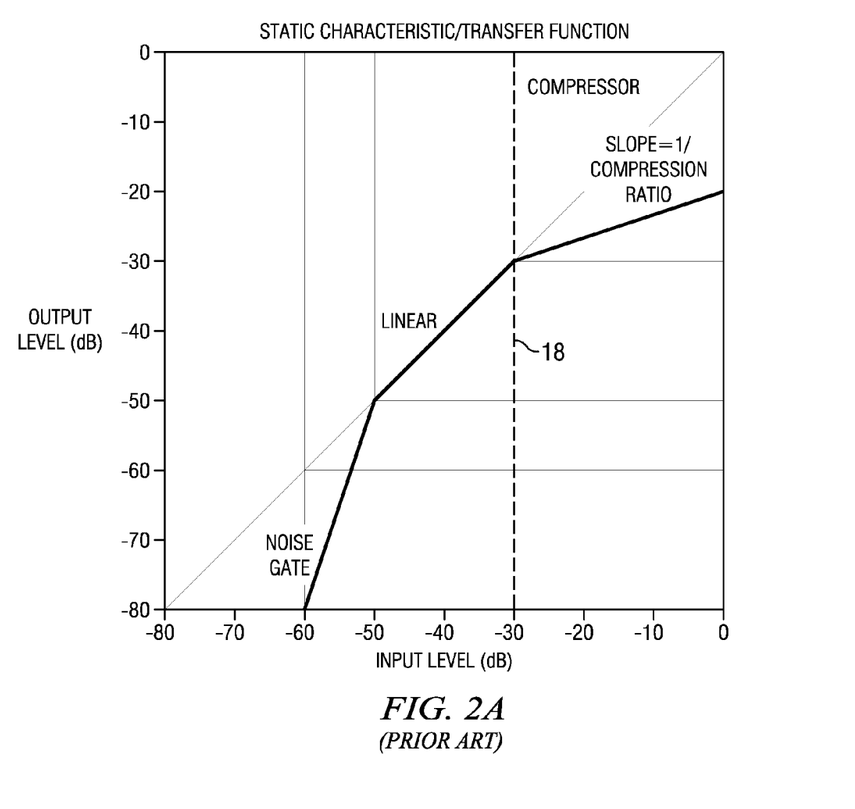
FIG. 2A shows an exemplary transfer function.
Figure 2B:
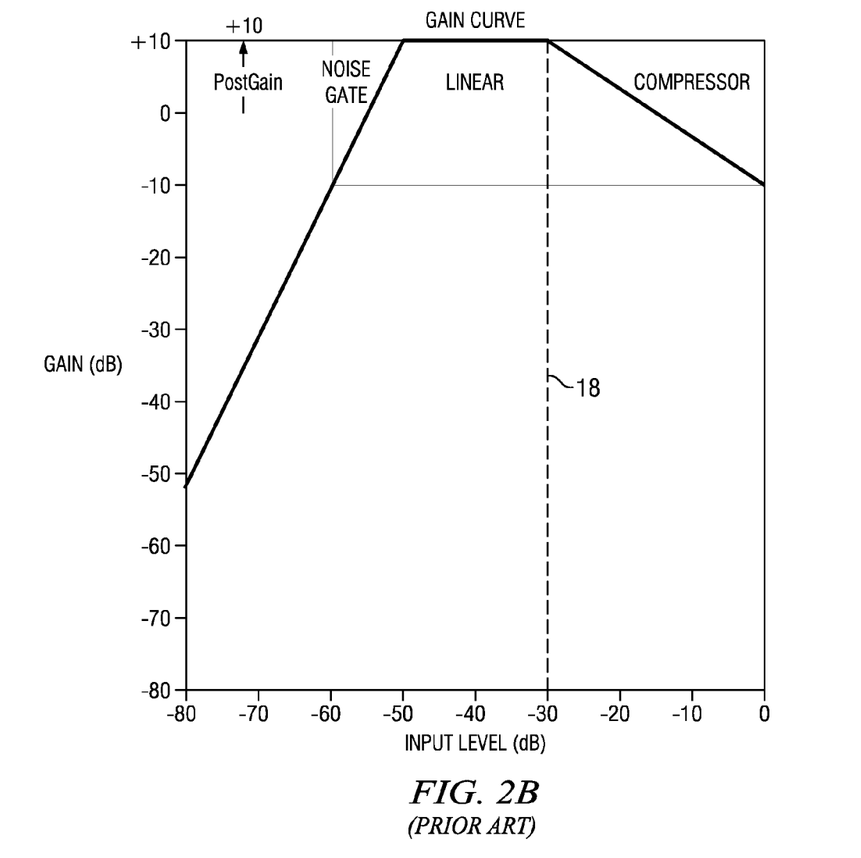
FIG. 2B shows a gain curve for the transfer function of FIG. 2A.

FIG. 1 is a block diagram of a typical feed-forward single-band dynamics compressor (C). Single-band (also known as wideband) dynamics compressors apply the same processing to the entire frequency range. The RMS level of an input signal 10 is extracted 12 and converted 14 to a logarithmic representation. Next, a transfer function (or characteristic) 16 maps the input signal level to a desired output level. FIG. 2A shows an exemplary transfer function 16. FIG. 2B illustrates the gain curve of the transfer function of FIG. 2A which results from the mapping of the input signal level to a desired output level. When the input level is less than the compression threshold 18 (−30 dB in this example), ignoring the noise gate region, each additional dB of input level produces one additional dB of output level. However, when the input level exceeds the compression threshold 18, each additional dB of input level only produces 1/r dB of additional output level, where r is the compression ratio (in FIG. 2A, r=3).

The gain is then converted 20 back from the logarithmic to a linear representation, smoothed 22 and applied 24 to a copy of the input signal 10 which has been delayed ($z^{-n}$) 26 to compensate for the delay of the gain computation path 28. Finally, some post-gain 30 may be applied 32 to help compensate for some of the gain loss due to the compression. More information on single-band dynamics compressors may be obtained from the following references (the disclosures of which are hereby incorporated by reference): G. W. McNally, "Dynamic Range Control of Digital Audio Signals," J. Audio Engineering Society, Vol. 32, No. 5, 1984 May; Udo Zölzer, Digital Audio Signal Processing, John Wiley & Sons Ltd., 1997, pp. 207-219; and Earl Vickers, "Automatic Long-term Loudness and Dynamics Matching," presented at the AES 111th Convention, New York, 2001.

Figure 3:
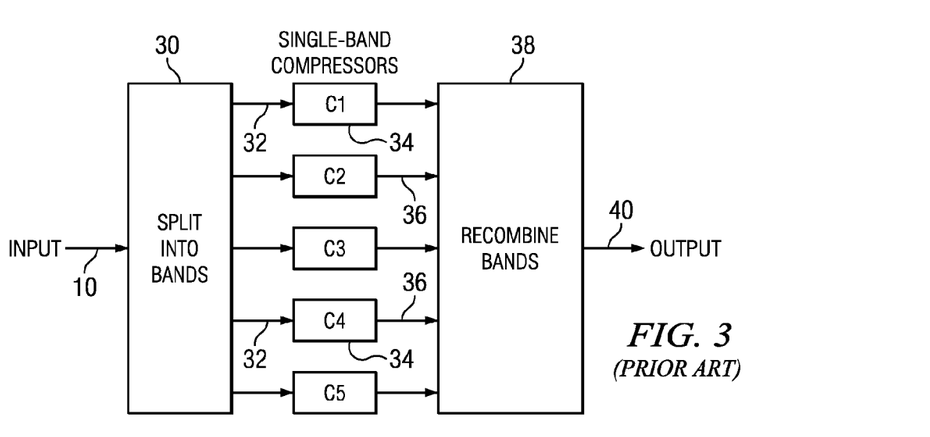
FIG. 3 is a block diagram of a typical feed-forward multi-band dynamics compressor.

A multiband dynamics compressor divides the frequency range into a plurality of frequency bands and then processes the input signal through each frequency band independently. In many implementations, a different set of processing parameters (such as compression ratios) is applied to each frequency band. FIG. 3 is a block diagram of a typical feed-forward multiband dynamics compressor. The input signal 10 is applied to a band splitting block 30 which divides the signal 10 in the frequency domain into a plurality of signals 32 each being limited to a certain frequency band, there being some degree of frequency overlap between adjacent ones of the frequency bands. In a frequency-domain implementation, frequency band splitting block 30 may consist of a fast Fourier transform (FFT) or short-time Fourier transform (STFT), with an optional analysis window; in a time-domain implementation, frequency band splitting block 30 may consist of one or more crossover filters. Each signal 32 is then applied to one of a plurality of included feed-forward single-band compressors (C1-C5) 34. Each compressor 34 may, for example, have a configuration like that of the compressor (C) shown in FIG. 1. The output signals 36 from the plurality of compressors 34 are then combined 38 together to generate a signal output 40. In a frequency-domain implementation, combining block 38 may consist of an inverse fast Fourier transform (IFFT) or inverse short-time Fourier transform (ISTFT), which may include an overlap-add implementation with optional synthesis window; in a time-domain implementation, combining block 38 may consist of a summer.

Multiband dynamics compressors are powerful, versatile tools for audio mastering, broadcast and playback. When used properly, multiband dynamics compressors have a number of advantages over single-band dynamics compressors, foremost being the fact that loud sounds in one band will not trigger artifacts such as "pumping" or "breathing" in the other bands. However, multiband dynamics compressors have a known problem relating to frequency response.

Figure 4:
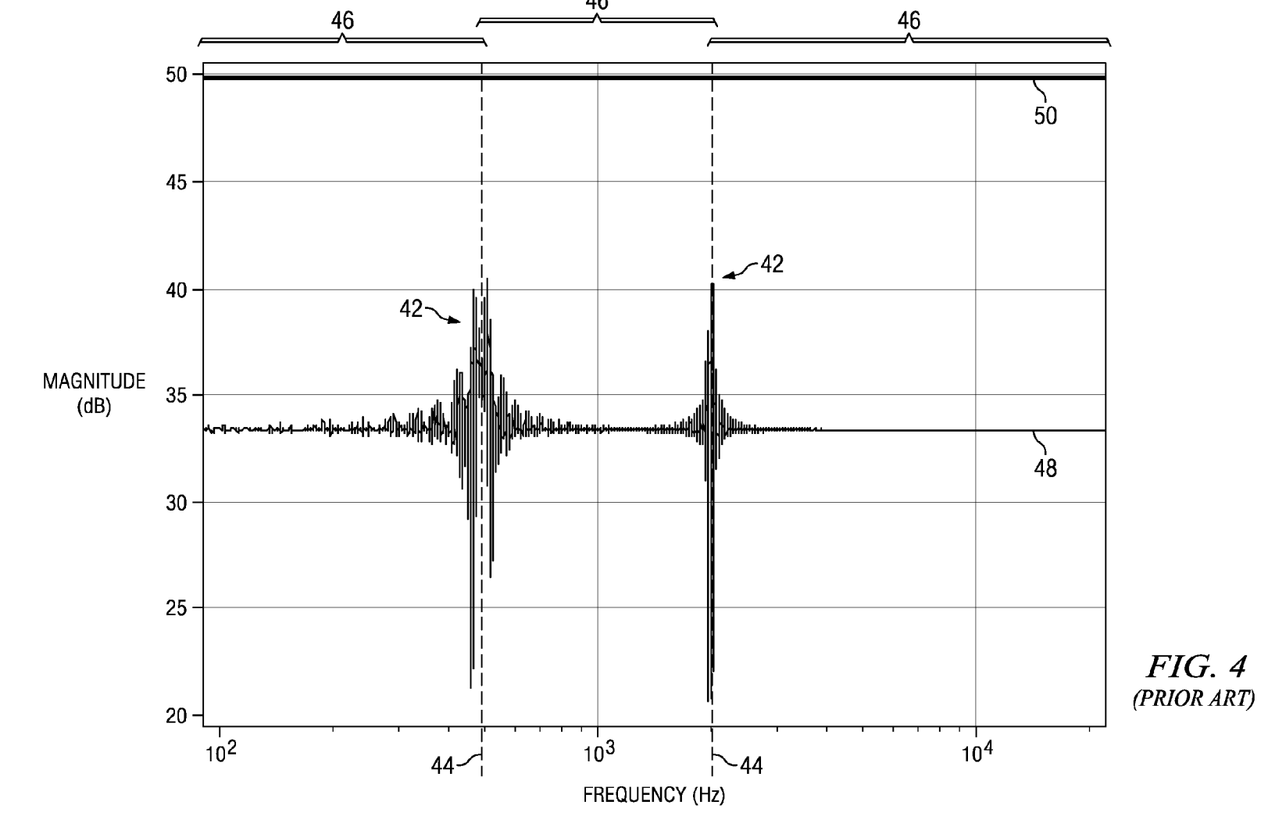
FIG. 4 illustrates the magnitude response of a multiband dynamics compressor of the type shown in FIG. 3 to a swept sinusoid.

It has been noted that while multiband compressors may have a generally flat spectral response to broad-band inputs, the narrow-band response exhibits peaks near the edges of the frequency bands. In other words, as shown in FIG. 4, when excited by a (time-varying) narrow-band input, such as a swept sinusoid, the magnitude response of the multiband dynamics compressor like that of FIG. 3 displays unwanted peaks 42 at the boundaries 44 between frequency bands 46. Specifically, FIG. 4 illustrates the magnitude response 48 of a multiband dynamics compressor of the type shown in FIG. 3 to a swept sinusoid 50 with band boundaries 44 located at 500 Hz and 2000 Hz. The unwanted peak 42 phenomenon is caused by the fact that, when a sinusoid's frequency is near the boundary 44 between two compressor frequency bands 46, only a portion of the sinusoid's energy is allocated to each frequency band 46. Therefore, the energy seen in each of the adjacent frequency bands 46 at the boundary 44 is not fully representative of the energy of the sinusoid signal 50. This triggers less compression of the sinusoid 50 at and near the boundary 44 than would occur at other frequencies located in the middle of the frequency bands 46. In other words, less dynamics compression is triggered with respect to the narrowband component at the boundary 44 between frequency bands 46 than if the entire energy of the narrowband component were allocated to a single one of the adjacent frequency bands. As a result, the response is not shift-invariant with respect to frequency. Those skilled in the art refer to this as a "3 dB bump" in the response; but is it recognized that the size of the peak 42 is a function of the compression ratio and can be as much as 6 dB.

It will be noted that absent the application of a non-linear compression, the energy would simply be split into two bands and then recombined with perfect reconstruction. The problem arises from the combination of the splitting of the energy into multiple bands and the applied non-linearity of the compressor. This problem occurs in all conventional multiband compressors, whether analog or digital, time-domain or frequency-domain.

In time-domain compressors, the bands are separated by cross-over filters having gain curves with a finite slope. For ease of calculating the sum of the band outputs, the use of Linkwitz-Riley crossovers, which have a gain of about −6 dB at the crossover frequency and in-phase outputs at all frequencies, is assumed. Similar compressor artifacts occur with other filters, such as odd-order Butterworth crossovers.

For an input sinusoid whose frequency is in the middle of a compressor frequency band, with RMS level X (in dBFS), threshold L (dBFS), compression ratio r, and slope S=1/r (slope of the transfer function's compressor line segment), the output RMS level is:

$$Y_c = \begin{cases} L + (X-L)s, & X > L \\ X & X <= L, \end{cases} \quad (1)$$

and the compressor gain in dB is:

$$G_c = Y_c - X = \max(X-L,0)(s-1), \quad (2)$$

where the subscript c signifies the case of a sinusoid near the center of the compressor band. For simplicity of notation, the time index has been omitted.

In the case of an input sinusoid midway between two compressor frequency bands, with the same input RMS level and a filter gain of F (in dBFS) at the crossover frequency, the output RMS level in each compressor band is given by:

$$Y_b = \begin{cases} L + (F+X-L)s, & F+X > L \\ F+X & F+X <= L, \end{cases} \quad (3)$$

and the compressor gain in each of the bands b is:

$$G_b = Y_b - (F+X) = \max(F+X-L,0)(s-1) \quad (4)$$

Since the Linkwitz-Riley crossover filters add in-phase at all frequencies, the total output RMS level of the sum of the two bands (in dB) is:

$$Y_s = 20\log_{10}\left(2 \cdot 10^{\frac{Y_b}{20}}\right) = 20\log_{10} 2 + Y_b, \quad (5)$$

where the subscript s signifies the sum of the two bands.

For sinusoids that exceed the threshold (after cross-over filtering) and are thus compressed, the difference between the within-band and between-band cases is given by $$d = Y_s - Y_c = 6 + sF, \quad (6)$$

assuming the input level X exceeds threshold L by more than the filter gain F.

Figure 5A:
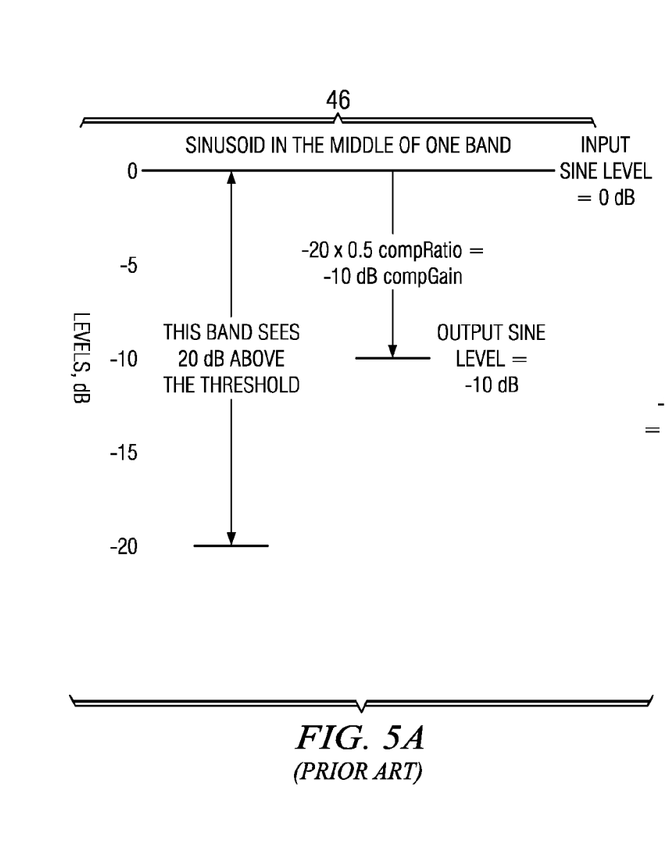
FIGS. 5A and 5B illustrate compressor operation dependent on frequency position of a sinusoidal input relative to the compressor frequency bands.
Figure 5B:
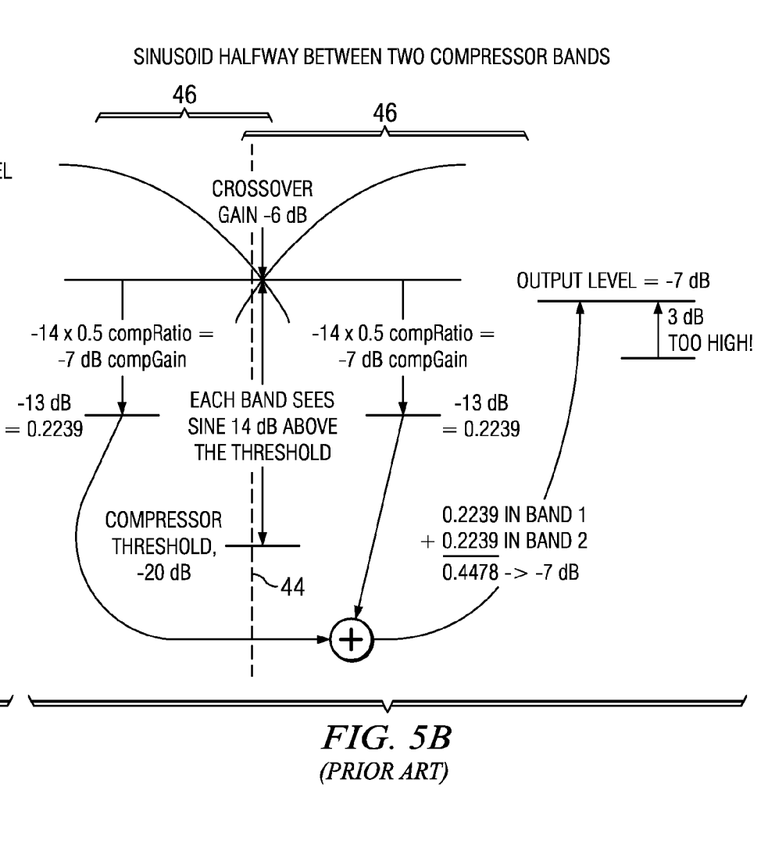

Reference is now made to FIGS. 5A and 5B. As an example, consider an X=0 dBFS sinusoid and a compressor with threshold L=−20 dB, compression ratio r=2 and slope s=0.5. If the input sinusoid is positioned in the middle of one of the compressor's frequency bands 46, as shown in FIG. 5A, the gain $G_c$ would be 20*(−0.5)=−10 dB, for an output level of $Y_c$=−10 dB.

On the other hand, if the sinusoid's frequency equals the crossover frequency (boundary 44) between two frequency bands 46, as shown in FIG. 5B, the crossover filter gain F will be −6 dB (with a Linkwitz-Riley crossover), so each adjacent frequency band 46 will see an RMS level of X+F=−6 dB. In this case, the gain $G_b$ will equal (−6+20)*−0.5=−7 dB, and the output level $Y_b$ in each band will be −6−7=−13 dB.

Since the Linkwitz-Riley crossover filters add in-phase at all frequencies, the amplitude of the sum of the two bands would be:

$$Y_s = 20\log_{10}\left(2 \cdot 10^{\frac{-13}{20}}\right) = -7 \text{ dB}. \quad (7)$$

The result is that the frequency response at the crossover frequency is d=6+(0.5*−6)=3 dB higher than the response elsewhere. The worst case is with an infinite compression ratio (s=0), in which case the response would have a 6 dB peak at the crossover frequency. Thus, it has been shown how the "3 dB peak" is produced at or near the boundary 44 between two adjacent frequency bands 46.

For compressors implemented in the frequency domain, one might assume that the bands would have a perfect brick-wall response, thereby preventing this problem. However, this assumption does not take into account the effect of the short-time Fourier transform's analysis filter (i.e., input window, in the time domain), which splatters some of the sinusoid's energy into each of the adjacent bands. As a result, a similar crossover peak occurs with frequency-domain compressors (as seen previously in FIG. 4).

In summary, less compression is applied to a sinusoid at the crossover frequency (boundary 44) between two frequency bands 46 than would have been applied had the sinusoid been in the middle of one of the compressor frequency bands. As a result, the response is not shift-invariant with respect to frequency. Note: this issue is not readily apparent in response to typical wideband audio signals.

The foregoing problem has been examined previously in terms of frequency-domain sampling of the power spectrum and it has been noted that a power-symmetric or perfect reconstruction filter bank does not present a satisfactory solution. Rather, a proposed solution (prior art) is to decrease the frequency-domain sampling interval (i.e., to increase the number of bands and the overlap between bands). This solution is analogized to what happens in the human ear. Each hair cell in the cochlea is tuned to a particular frequency by the cochlea's mechanical resonance, which functions as sort of a mechanical Fourier transform. While the hair cells are very closely spaced in frequency, each one is sensitive to a bandwidth of roughly ⅓ octave, so they are heavily overlapped. The proposed solution, however, does not totally eliminate the problem, but with sufficiently overlapped bands the problem can be greatly minimized. Unfortunately, this approach requires a heavily oversampled filter bank, which can be relatively expensive to implement. There accordingly exists a need in the art for a more economic and successful solution.

SUMMARY

The present invention proposes a multiband dynamics compressor having a frequency-domain solution addressing the unwanted magnitude peaks which may occur at the crossover frequency (boundary) between two adjacent frequency bands. In accordance with this solution, slight adjustments to the frequency band boundary locations are made in order to prevent a spectral peak (such as, for example, a sinusoidal peak) in the input signal from being located midway between two frequency bands.

In an embodiment, a multiband dynamics compressor comprises: a frequency domain splitting block adapted to split a received signal into a plurality of frequency bins and assign those frequency bins to frequency bands divided by variably located frequency boundaries; a spectral analysis block adapted to measure energy of at least those frequency bins located at or near the frequency boundaries; a frequency band adjustment block responsive to the measured energy and adapted to vary locations of the frequency boundaries which divide the frequency bands; a dynamics compressor for each frequency band, the compressor receiving the frequency bins within the associated frequency band; and a combiner adapted to combine outputs of the compressors to generate an output signal.

In an embodiment, a method comprises: splitting a received signal into a plurality of frequency bins; assigning those frequency bins to frequency bands divided by variably located frequency boundaries; measuring spectral energy of at least those frequency bins located at or near the frequency boundaries; varying locations of the frequency boundaries which divide the frequency bands in response to the measured spectral energy; individually applying dynamics compression against each frequency band to generate compressed outputs; and combining the compressed outputs to generate an output signal.

DETAILED DESCRIPTION OF THE DRAWINGS

Figure 6:
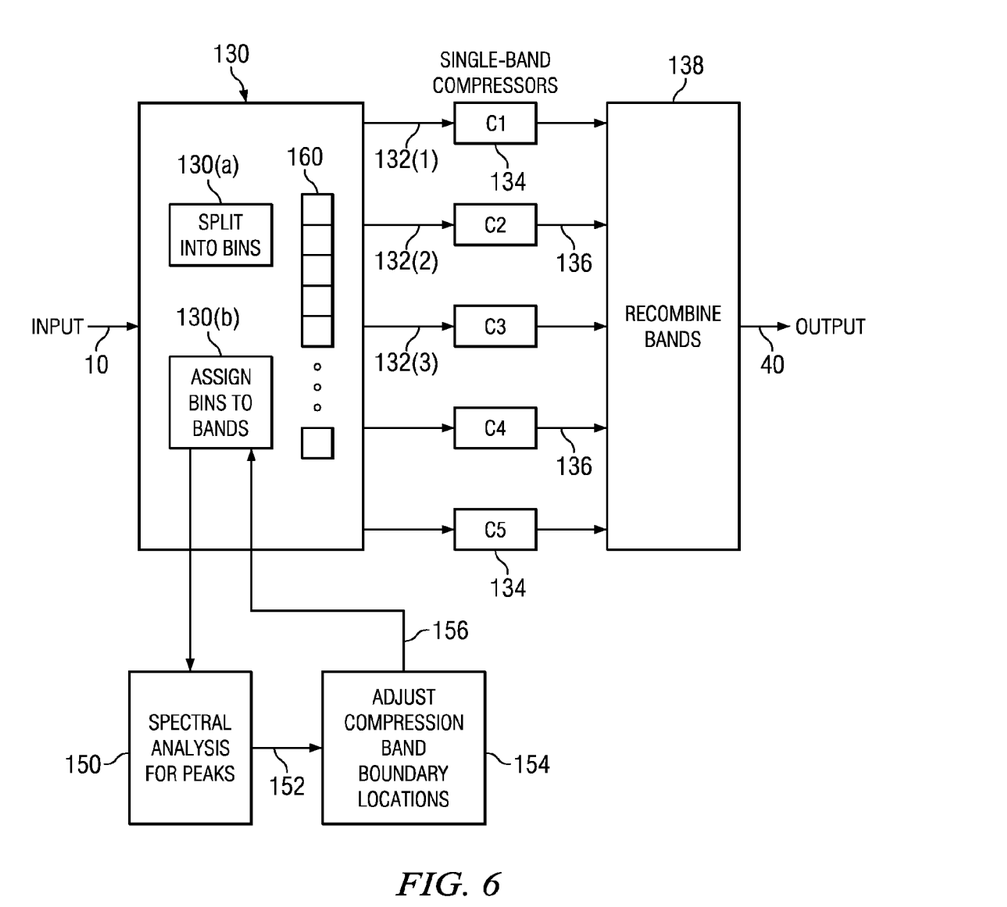
FIG. 6 is a block diagram of a feed-forward multiband dynamics compressor having a frequency band boundary adjustment feature.

Reference is now made to FIG. 6 which illustrates a block diagram of a feed-forward multiband dynamics compressor having a frequency band boundary adjustment feature. The input signal 10 is applied to a frequency domain splitting block 130 including a functionality 130(a) which divides the signal 10 in the frequency domain into a plurality of frequency bins 160. As an example, the functionality 130(a) may comprises a fast Fourier transform (FFT) applied to the input signal 10 to generate the plurality of frequency bins in a manner well known to those skilled in the art. More specifically, a short-time Fourier transform (STFT) or similar method may be used by the functionality 130(a) for frame-by-frame processing of the signal 10.

In the prior art implementation of FIG. 3, these frequency bins would be grouped together to form frequency band signals 32 such that each signal 32 includes frequency bins within a certain frequency band 46, there being some degree of frequency overlap between adjacent ones of the frequency bands at the boundaries 44. This grouping of frequency bins into frequency bands, however, is fixed by the configuration of the band splitting block 30.

The implementation of FIG. 6 differs from FIG. 3 in that frequency domain splitting block 130 has no fixed grouping of frequency bins into frequency bands and associated frequency band signals 132. Rather, the grouping of frequency bins into frequency bands associated with frequency band signals 132 is performed dynamically by functionality 130(b) (for example, on STFT frame-by-frame basis or other periodic or aperiodic measure) such that the frequency bins 160 assigned to each frequency band (and its frequency band signal 132) are changeable over time so as to adjust to changes in the spectral energy of the input signal 10.

Figure 7A:
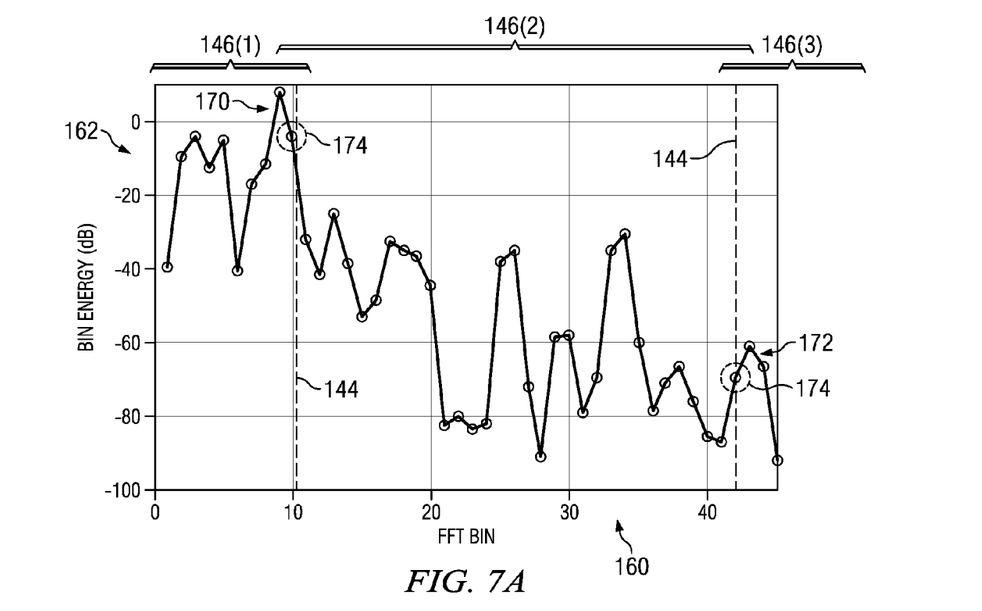
FIGS. 7A and 7B illustrate an exemplary spectral analysis of an input signal and the operation of the compressor of FIG. 6 to perform frequency band boundary adjustment in response to the spectral analysis.

The compressor of FIG. 6 further includes a spectral analysis block 150 which operates to analyze the frequency bins 160 of the frequency split input signal 10 provided by the functionality 130(a) of the frequency domain splitting block 130. The spectral analysis block 150 operates to measure the energy in at least certain ones of the frequency bins 160. FIG. 7A illustrates the results of such a spectral analysis performed by the block 150 with respect to an exemplary input signal 10 and all generated frequency bins 160. The functionality 130(a) of the frequency domain splitting block 130 has performed FFT on the input signal 10 to produce a plurality of frequency bins 160 (in this case, forty-five frequency bins). The spectral analysis block 150 has calculated the energy 162 of the input signal 10 in each of those frequency bins 160. It will be noted that the energy 162 varies across the plurality of frequency bins 160. There are some bins 160 where the energy is relatively high and other bins where the energy is relatively low giving rise to the presence of numerous spectral peaks in the input signal for a given frame.

Assume now an initial definition (for example, for a certain frame) of the boundaries 144 between frequency bands 146 (as shown in FIG. 7A) by functionality 130(b) of the multi-band compressor of FIG. 6. The circled frequency bins 174 are located at the boundaries 144. In accordance with this boundary definition, the frequency bins 160 within frequency band 146(1) are applied by functionality 130(b) to a first C1 of the single band compressors 134 (through signal 132(1)), while the frequency bins 160 within frequency band 146(2) are applied by functionality 130(b) to a second C2 of the single band compressors 134 (through signal 132(2)), and the frequency bins 160 within frequency band 146(3) are applied by functionality 130(b) to a third C1 of the single band compressors 134 (through signal 132(3)). This initial definition of the boundaries 144, however, presents a boundary concern as discussed above with respect to FIGS. 3-5 because significant signal spectral energy in frequency bins 160 (a spectral peak) is present at or near the location of the boundaries 144 and thus that signal energy will be processed by two signal band compressors 134 and produce the so-called "3 dB bump" in the output as shown in FIG. 4. Note, for example, the adjacent relatively high energy bins 160 forming spectral peaks at 170 and 172 which are located at or near the boundaries 144 between two adjacent frequency bands 146. It is at these frequency locations where the "3 dB bump" will be present.

The spectral analysis block 150, from the measured energy in the frequency bins 160, provides spectral peak information 152 to a frequency band adjustment block 154. In this context, for example, a spectral peak may be defined as a frequency bin 160 whose energy magnitude is greater than that of each of its two lower and two upper neighboring frequency bins. Responsive to the spectral peak information 152, the frequency band adjustment block 154 determines whether the boundary 144 between frequency bands 146 needs to be moved and if so further determines a preferred location of the boundary 144, based on the location of the spectral peaks in the signal 10. The movement of the boundary 144 location changes the assignment of frequency bins 160 to frequency bands 146. The operation of the frequency band adjustment block 154 in moving the boundary 144 location accordingly changes the assignment by functionality 130(*b*) of frequency bins 160 to the frequency bands 146 associated with the frequency band signals 132 applied to the single band compressors 134. The change in frequency bin assignment is made with an effort to place the frequency bins 160 having relatively higher spectral energy associated with a spectral peak within a single frequency band 146 and away from the boundaries 144. A result of this operation is that the majority of the energy for a spectral peak will be associated with a single frequency band 146 (instead of being split between adjacent bands).

Figure 7B:
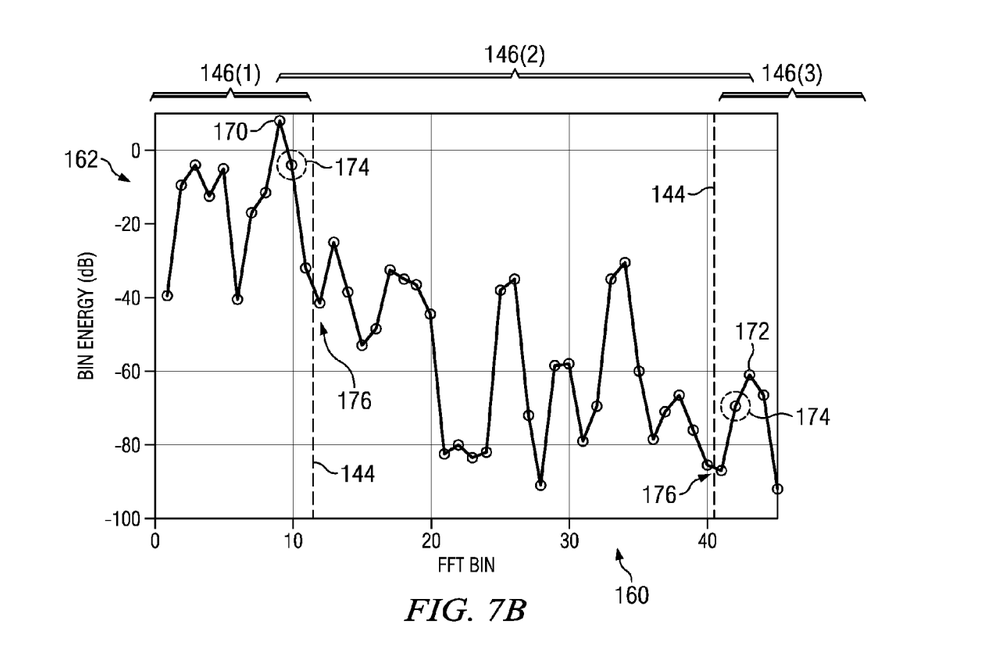

A definition of the boundaries 144 between frequency bands 146 for the multiband compressor, revised in response to the spectral peak information 152 and operation of the frequency band adjustment block 154 for the same certain frame, is shown in FIG. 7B. The same spectral analysis performed by the block 150 with respect to an exemplary input signal 10 is shown in FIG. 7B. What has changed, however, is the location of the boundaries 144. The frequency band adjustment block 154 has moved the boundaries 144 away from the spectral peaks at 170 and 172 and towards frequency bins 160 with relatively lower spectral energy. The frequency bins 160 within frequency band 146(1) are applied by functionality 130(*b*) to a first C1 of the single band compressors 134 (through signal 132(1)), while the frequency bins 160 within frequency band 146(2) are applied by functionality 130(*b*) to a second C2 of the single band compressors 134 (through signal 132(2)), and the frequency bins 160 within frequency band 146(3) are applied by functionality 130(*b*) to a third C1 of the single band compressors 134 (through 132(3)). The effect of the movement of the boundaries 144 away from relatively higher spectral energy frequency bins 160 results in the majority of each spectral peak's energy being associated with a single frequency band 146. For example, in FIG. 7B, as a result of the movement of the lower boundary 144, the majority of spectral peak 170 is now located within frequency band 146(1), and as a result of the movement of the upper boundary 144, the majority of spectral peak 172 is now located within frequency band 146(3). The single band compressors 134 receiving the frequency band signals 132 for each frequency band 146 will accordingly see nearly all the energy of the spectral peaks for the input signal 10, allowing computation of the correct amount of compressor gain and avoiding the "3 dB bump" problem experienced by prior art compressors.

With reference once again to FIG. 6, the spectral analysis block 150 thus performs an energy measurement with respect to the frequency bins 160 for a current frame of the input signal 10. An identification is made of the existence of spectral peaks near or at the boundary 144 locations which were applied to a previous frame, and the frequency band adjustment block 154 responds by shifting the location of the boundaries 144 applied by the functionality 130(*b*) of the frequency domain splitting block 130 in defining the frequency bands 146 and generating the plurality of frequency band signals 132. The plurality of compressors 134 then process the signals 132 producing output signals 136 which are recombined 138 to generate the output signal 40. The process is then repeated with respect to the frequency bins 160 of a next frame of the input signal 10. In this implementation, the boundary 144 locations applied by the frequency domain splitting block 130 in defining the frequency bands 146 may change on a frame-by-frame basis. A hysteresis factor may be used to prevent ping-pong movement of the boundaries 144 with each frame change. It will also be understood that frame-by-frame analysis may be unnecessary or undesired for some input signals 10. As an alternative, the analysis and change rate may instead span a plurality of frames, or be defined by some other periodic or aperiodic measure. Still further, the change in boundary 144 location may alternatively be triggered in response to a spectral analysis comparing the measured energy of a current frame against a threshold, average or other parameters so as to detect changes in signal energy which may warrant movement of the boundary 144 locations.

Figure 8:
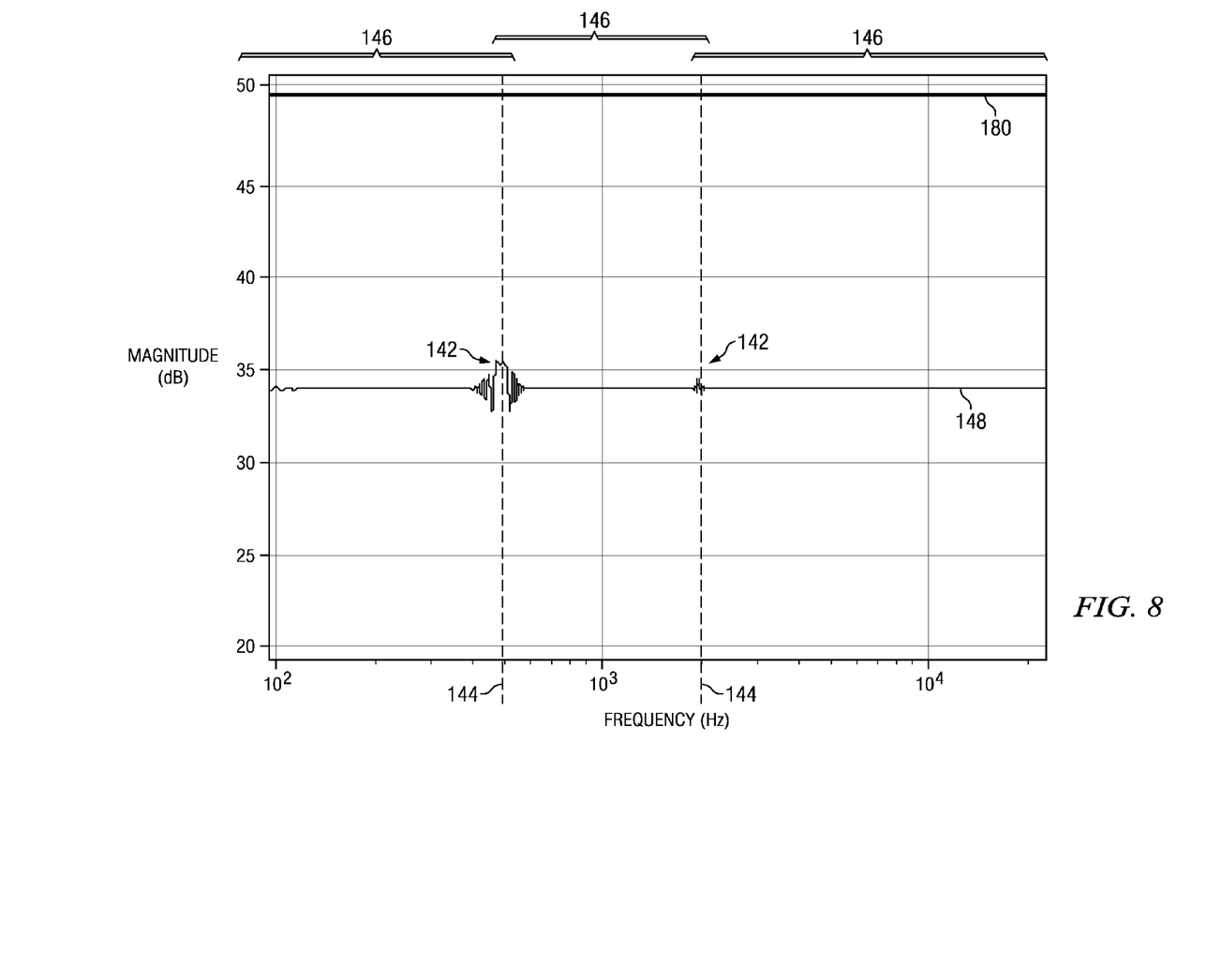
FIG. 8 illustrates the magnitude response of a multiband dynamics compressor of the type shown in FIG. 6 to a swept sinusoid.

Reference is now made to FIG. 8 which illustrates the magnitude response 148 of a multiband dynamics compressor of the type shown in FIG. 6 to a swept sinusoid 180. The spectral analysis block 150 measures the energy in each of the frequency bins 160 as the sinusoid is swept. As the measured energy peaks near the band boundaries 144 located at about 500 Hz and 2000 Hz, the frequency band adjustment block 154 responds to the spectral peak information 152 and adjusts the location of the boundaries 144 in the frequency domain so that almost all of the sinusoid's energy will be associated with a single compressor frequency band 146 instead of being divided between two adjacent frequency bands due to spectral splatter. Thus, the compressor frequency band 146 sees nearly the full energy of the sinusoid, thus allowing for the computation of the correct amount of compressor gain. In comparing FIG. 8 to FIG. 4, it will be noted that the multiband dynamics compressor of the type shown in FIG. 6 significantly improves compressor performance. The peak 42 seen in FIG. 4 at the 2000 Hz breakpoint is almost completely eliminated (reference 142). Although FIG. 8 shows a 1 dB peak at 500 Hz (reference 142), this peak is attributed to splatter beyond the two adjacent FFT frequency bins 160, and the improvement in performance over FIG. 4 is readily apparent.

Thus, when a spectral peak occurs near a boundary 144 between compressor frequency bands 146, the multiband dynamics compressor of the type shown in FIG. 6 adjusts the boundary location slightly so that most of the energy of the spectral peak is consolidated into the same compressor frequency band. This allows the compressor gain to be computed based on the vast majority of the energy belonging to that signal.

With respect to the action taken by the frequency band adjustment block 154 (in response to the spectral peak information 152) to adjust the location of the boundaries 144, it will be recognized that the process essentially splits the frequency axis into "regions of influence." One option for making this adjustment is to split the frequency axis halfway between two adjacent peaks. Another option is to split the frequency axis at the lowest magnitude FFT bin between two adjacent peaks. Either of these techniques is believed to work well for setting the location of the boundaries 144.

The operation taken in moving the boundaries 144 from the location in FIG. 7A to the location in FIG. 7B illustrates the preferred option for splitting the frequency axis halfway between two adjacent peaks. More specifically, the splitting algorithm implemented by the frequency band adjustment block 154 determines whether the number of in-between bins is odd (i.e., one bin is exactly halfway between the two adjacent peaks). If so, the algorithm groups the middle bin with its largest immediate neighbor (or, equivalently, moves the dividing line halfway toward the smaller neighbor).

In FIG. 7A, the original boundaries 144 were located at the circled frequency bins 174 (FFT bin #10 and bin #42). After performing the adjustment, FIG. 7B shows that the lower boundary 144 is now located between bin #11 and bin #12.

This groups the middle bin #11 (located exactly halfway between adjacent spectral peak locations at bin #9 and bin #13) with its largest immediate neighbor at bin #10. The upper boundary is now located between bin #40 and bin #41, since the average of the adjacent spectral peak locations at bin #38 and bin #43 is 40.5.

The operation to select the peaks and divide up the frequency axis results in the allocation of the energy of the input signal 10 contained within those frequency bins 160 located between spectral peaks to the appropriate frequency bands 146. As a result, almost all of the energy of the signal 10 associated with a given spectral peak will be associated with a single compressor frequency band 146 instead of being divided between two adjacent bands due to spectral splatter. Since the compressor frequency band sees nearly the full energy of the spectral peak of the signal 10, the correct amount of compressor gain is applied to the signal.

It should be noted that the boundary 144 between frequency bands 146 as determined by the frequency band adjustment block 154 in respect to the spectral information may vary from one STFT frame to the next. This variation generally does not cause significant artifacts, probably due to the fact that the frequency axis is always divided at frequency bins 160 where the energy magnitude is relatively low. However, any low-level artifacts resulting from the movement of the boundary 144 could be minimized by having the frequency band adjustment block 154 apply hysteresis in the processing algorithm so as to keep frequency bins 150 from jumping back and forth unnecessarily between two adjacent frequency bands 146. In other words, the hysteresis would prevent unnecessary movement of the boundary 144 which divides two adjacent frequency bands 146 from one STFT frame to the next.

While FIGS. 7A and 7B show the measurement of energy in all of the frequency bins 160 of the signal 10, it will be understood that such measurement as to all bins is not required. The default location of the boundaries 144 is known. The spectral analysis block 150 need only perform energy measurement as to those frequency bins 160 near the default boundary 144 locations. In FIGS. 7A and 7B, for example, the spectral analysis block 150 need not make energy measurements for bins 160 from bin #15 to bin #35 because these bins are not located near the default boundary 144 locations at about bin #8-12 and bin #40-44. By focusing energy measurement operations by the spectral analysis block 150 on the default location of the boundaries 144, there is a reduction in the computational cost of operations, such as selecting spectral peaks, performed by the multiband dynamics compressor of the type shown in FIG. 6.

An example of an algorithm (presented in pseudo-code) for selecting boundary 144 locations is as follows:

```
for each band boundary
    lowerPeak = first peak below the boundary
    upperPeak = first peak above the boundary
    if there are upper and lower peaks
        boundary = 0.5 * (lowerPeak + upperPeak)
        if boundary is an integer
            move it halfway toward the smaller neighbor
        end
    else // no upper and/or lower peaks
        if no lower peak
            extend this band back to the previous boundary
```

-continued

```
        else // no upper peak
            extend this band up to the next boundary
        end
    end
end
```

With reference once again to FIG. 8 and the 1 dB peak at 500 Hz (reference 142), it is believed that the implementation of a more sophisticated algorithm than that presented above could further reduce the remaining ripple. The algorithm presented above is simply one proposed implementation, it being understood that other algorithms could be designed to control movement of the boundaries 144 between frequency bands 146 in response to the measured spectral energy of the input signal 10.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A multiband dynamics compressor, comprising:
    a frequency domain splitting block adapted to split a received signal into a plurality of frequency bins and assign those frequency bins to frequency bands divided by variably located frequency boundaries;
    a spectral analysis block adapted to measure energy of at least those frequency bins located at or near the frequency boundaries;
    a frequency band adjustment block responsive to the measured energy and adapted to vary locations of the frequency boundaries which divide the frequency bands;
    a dynamics compressor for each frequency band, the compressor receiving the frequency bins within the associated frequency band; and
    a combiner adapted to combine outputs of the compressors to generate an output signal.

2. The compressor of claim 1, wherein the frequency domain splitting block comprises a fast Fourier transform (FFT) for processing the received signal and generating the plurality of frequency bins.

3. The compressor of claim 1, wherein the frequency domain splitting block comprises a short-time Fourier transform (STFT) for processing the received signal and generating the plurality of frequency bins.

4. The compressor of claim 1, wherein the frequency domain splitting block generates the frequency bins with respect to a frequency transform frame of the received signal, the frequency band adjustment block varying locations of the frequency boundaries which divide the frequency bands with respect to said frequency transform frame.

5. The compressor of claim 1, wherein the frequency band adjustment block further comprises a hysteresis function applied in deciding whether to vary locations of the frequency boundaries which divide the frequency bands.

6. The compressor of claim 1, wherein the frequency band adjustment block is further adapted to calculate the location to which the frequency boundary which divides two frequency bands is to be varied as a location between adjacent peaks in the measured energy of those frequency bins located at or near the frequency boundary.

7. The compressor of claim 6, wherein the location between adjacent peaks is halfway between those adjacent peaks.

8. The compressor of claim 6, wherein the location between adjacent peaks is a lowest spectral energy location between those adjacent peaks.

9. The compressor of claim 1, wherein the spectral analysis block identifies, from the measured energy of the frequency bins located at or near the frequency boundaries, the presence of a spectral peak of energy, and wherein the frequency band adjustment block responds to the identified spectral peak by varying the location of the frequency boundary away from the spectral peak.

10. The compressor of claim 1, wherein the spectral analysis block identifies, from the measured energy of the frequency bins located at or near the frequency boundaries, the presence of a plurality of spectral peaks of energy, and wherein the frequency band adjustment block responds to the identified spectral peaks by varying the location of the frequency boundary to a frequency position between adjacent spectral peaks.

11. The compressor of claim 10, wherein the frequency position is halfway between adjacent spectral peaks.

12. The compressor of claim 10, wherein the frequency position is a position associated with frequency bin whose measured energy is lowest between adjacent spectral peaks.

13. A method, comprising:
splitting a received signal into a plurality of frequency bins;
assigning those frequency bins to frequency bands divided by variably located frequency boundaries;
measuring spectral energy of at least those frequency bins located at or near the frequency boundaries;
varying locations of the frequency boundaries which divide the frequency bands in response to the measured spectral energy;
individually applying dynamics compression against each frequency band to generate compressed outputs; and
combining the compressed outputs to generate an output signal.

14. The method of claim 13, wherein splitting comprises applying fast Fourier transform (FFT) to the received signal to generate the plurality of frequency bins.

15. The method of claim 13, wherein splitting comprises applying short-time Fourier transform (STFT) to the received signal to generate the plurality of frequency bins.

16. The method of claim 13, wherein splitting generates the frequency bins with respect to a frequency transform frame of the received signal, and varying comprises varying locations of the frequency boundaries which divide the frequency bands with respect to said frequency transform frame.

17. The method of claim 13, wherein varying further comprises applying a hysteresis function in deciding whether to vary locations of the frequency boundaries which divide the frequency bands.

18. The method of claim 13, wherein varying further comprises calculating the location to which the frequency boundary which divides two frequency bands is to be varied as a location between adjacent peaks in the measured energy of those frequency bins located at or near the frequency boundary.

19. The method of claim 18, wherein the location between adjacent peaks is halfway between those adjacent peaks.

20. The method of claim 18, wherein the location between adjacent peaks is a lowest spectral energy location between those adjacent peaks.

21. The method of claim 13, further comprising identifying, from the measured energy of the frequency bins located at or near the frequency boundaries, the presence of a spectral peak of energy, and wherein varying further comprises responding to the identified spectral peak by varying the location of the frequency boundary away from the spectral peak.

22. The method of claim 13, further comprising identifying, from the measured energy of the frequency bins located at or near the frequency boundaries, the presence of a plurality of spectral peaks of energy, and wherein varying further comprises responding to the identified spectral peaks by varying the location of the frequency boundary to a frequency position between adjacent spectral peaks.

23. The method of claim 22, wherein frequency position is halfway between adjacent spectral peaks.

24. The method of claim 22, wherein the frequency position is a position associated with frequency bin whose measured energy is lowest between adjacent spectral peaks.

25. A multiband dynamics compressor, comprising:
means for processing a signal in the frequency-domain to split the signal into a plurality of frequency bands;
means for spectrally analyzing said signal to identify the occurrence of magnitude peaks in said signal;
means for adjusting locations of boundaries between adjacent ones of the plurality of frequency bands by automatically adjusting a location of the boundary between two adjacent frequency bands in order to prevent the identified magnitude peak in said signal from being located at a frequency position that is between said two adjacent frequency bands; and
means for applying dynamics compression individually against each of the adjacent frequency bands.

* * * * *